United States Patent [19]

Klemer et al.

[11] Patent Number: 5,508,630
[45] Date of Patent: Apr. 16, 1996

[54] PROBE HAVING A POWER DETECTOR FOR USE WITH MICROWAVE OR MILLIMETER WAVE DEVICE

[75] Inventors: David P. Klemer, Arlington, Tex.; Chun-Yao Chen, Hsinchu, Taiwan; John L. Allen, Richardson; Ahmad R. S. Gousheh, Arlington, both of Tex.

[73] Assignee: Board of Regents, University of Texas Systems, Austin, Tex.

[21] Appl. No.: 303,865

[22] Filed: Sep. 9, 1994

[51] Int. Cl.$^6$ ............................................. C01R 1/06
[52] U.S. Cl. ............................................. 324/762; 324/754
[58] Field of Search ............................... 324/73.1, 158.1, 324/754, 762, 642, 646, 758, 601; 333/246, 248, 33, 34; 455/327; 364/481, 571.01

[56] References Cited

U.S. PATENT DOCUMENTS

| | | | |
|---|---|---|---|
| 3,794,914 | 2/1974 | Aslan | 324/95 |
| 4,006,425 | 2/1977 | Chang et al. | 333/84 R |
| 4,161,692 | 7/1979 | Tarzwell | 324/754 |
| 4,704,576 | 11/1987 | Tributsch et al. | 324/752 |
| 4,803,419 | 2/1989 | Roos | 324/642 |
| 4,853,627 | 8/1989 | Gleason et al. | 324/754 |
| 4,965,514 | 10/1990 | Herrick | 324/754 |
| 4,980,636 | 12/1990 | Romanofsky et al. | 324/754 |
| 5,003,253 | 3/1991 | Majidi-Ahy et al. | 324/754 |
| 5,148,103 | 9/1992 | Pasiecznik, Jr. | 324/758 |
| 5,231,349 | 7/1993 | Majidi-Ahy et al. | 324/754 |

FOREIGN PATENT DOCUMENTS 62-179125 8/1987 Japan.

OTHER PUBLICATIONS

Allen et al., "On–Wafer Measurement and Modeling of Millimeter–Wave GaAs Schottky Mixer Diodes," 1992 IEEE MTT–S *International Microwave Symposium Digest*, pp. 743–746, 1992 International Microwave Symposium, Albuquerque, NM; Jun. 1992.

Ladbrooke, "Improved Instrument for Probing Static Potential Profiles in Semiconductor Devices," *Electronics Letters*, vol. 9, No. 14 (Jul. 12, 1973).

*Primary Examiner*—Vinh P. Nguyen
*Attorney, Agent, or Firm*—Arnold, White & Durkee

[57] ABSTRACT

A system for probing a circuit is disclosed. In particular, a system for monitoring power levels close to the tip of a measurement probe in order to more accurately monitor the power applied to a circuit is contemplated. Microwave and millimeter wave signals are monitored through the use of a directional coupler which is mounted proximate the probe tip of a measurement probe. Power delivered to the probe tip is then detected by a signal created in the directional coupler. Connected to the directional coupler is a diode. The voltage across the diode is monitored and is indicative of the power delivered to the probe tip. A control signal resulting from the diode voltage may provide feedback control to a power source which delivers power to the measurement probe. Thus, utilizing feedback control a more accurate power delivery system is provided.

11 Claims, 4 Drawing Sheets

PROBE HAVING A POWER DETECTOR FOR USE WITH MICROWAVE OR MILLIMETER WAVE DEVICE

The Government has certain rights in this invention.

BACKGROUND OF THE INVENTION

This invention relates to a measurement probe for solid state devices and, more particularly, to a measurement probe having a power detector for constant power microwave or millimeter wave device measurements. Microwave or millimeter wave integrated circuits require measurement probes that are designed specifically for microwave or millimeter wave purposes. A common measurement probe used for microwave or millimeter wave circuits comprises a dielectric substrate, a coplanar waveguide and a structure to which the substrate is attached. The coplanar waveguide typically includes a central coplanar waveguide signal line and two adjacent coplanar waveguide ground planes. Such measurement probes are well known in the art.

FIGS. 1 and 2 illustrate a typical prior art measurement probe. FIG. 1 illustrates a side view of measurement probe 8. The measurement probe has a microwave coaxial input connecter 10, a probe body 12, a probe substrate 14, a probe tip 16, a coaxial to coplanar waveguide transition connection 18, and a coplanar waveguide surface 20. FIG. 2 shows a bottom view of measurement probe 8 illustrating the detail of the coplanar waveguide surface 20. Coaxial to coplanar waveguide connection 18 connects to coplanar waveguide signal line 24. Coplanar waveguide signal line 24 extends from connection 18 to probe tip 16. Flanking coplanar waveguide signal line 24 are coplanar waveguide ground planes 26 and 28. Measurement probes such as shown in FIGS. 1 and 2 are commercially available from a variety of sources including, for example, Tektronix, Inc. and Cascade Microtech, Inc.

FIG. 3 shows a block diagram of a typical test configuration using a microwave measurement probe. A microwave or millimeter wave source 30 is used to generate a signal to be applied to a device, such as an integrated circuit 34. The wave is transmitted through coaxial cable 32 and measurement probe 8 to integrated circuit 34. One problem with such test configuration is that the power output of source 30 will often vary as the frequency of source 30 varies, as measured at the point where probe 8 contacts integrated circuit 34. In the past, this power variation problem has been addressed by connecting discrete power detecting circuits at the output of source 30 between source 30 and coaxial cable 32 and feeding back signals from the power detecting circuits to source 30. Then, the power emitted from source 30 may be changed in response to the detected signal so that a constant power is emitted at the source as the frequency changes. Such power detecting circuits often include a combination of coaxially connected directional couplers and coaxially connected Schottky detector diodes, or (at higher frequencies) a combination of rectangular-waveguide directional couplers and rectangular-waveguide-mounted Schottky detector diodes.

U.S. Pat. No. 5,003,253 to Majidi-Ahy et al. is an example of measurement probes that contemplate both diodes and directional couplers. However, in Majidi-Ahy et al. the diodes are used as nonlinear elements for harmonic generation to optimize harmonic signal generation. Thus, circuitry for power level detection and control is not proposed.

It is desirable to more accurately maintain a constant power output to an integrated circuit device than is obtained with the probe systems described above. Furthermore, it is desirable to maintain such constant power output with a simplified approach that does not require additional connections of coaxially coupled or rectangular-waveguide-coupled power detector systems.

SUMMARY OF THE INVENTION

The present invention is directed at problems of the type described above. In one broad aspect, the invention proposes a system for monitoring power levels close to the tip of a measurement probe in order to more accurately monitor the power applied to a circuit. In a more specific aspect, the invention comprises a system for regulating the power delivered to a circuit by means of a probe, wherein the power delivered to the circuit is measured at the probe tip for feedback power control. In one preferred embodiment, a directional coupler is built into a microwave or millimeter wave coplanar waveguide measurement probe adjacent the coplanar waveguide signal line. A Schottky diode is connected to the directional coupler in order to create a DC voltage that varies with the RF power passing through the probe. The DC voltage across the Schottky diode may serve as a feedback signal to control the power output of a signal source.

In one aspect, the present invention includes a measurement probe for integrated circuits including a probe tip, a signal conductor, and a power detector circuit proximate to the probe tip. The signal conductor operates to provide a signal to the probe tip and the power detector operates to generate a signal in response to the power of the signal provided through the signal conductor. The power detector may include a directional coupler which has a diode connected to one end.

In another aspect, the present invention includes a device for making measurements on an integrated circuit in which a probe including probe tip, a ground plane and a signal conductor are adapted to conduct an AC signal from an AC power source to the probe tip. A power detector is mounted on the probe to generate a DC signal in response to and indicative of the power of the AC signal received at the probe tip. Further, a feedback loop is adapted to conduct a DC signal as a power control signal from the power detector to the AC power source. Once again, the power detector may include a directional coupler which has a diode, for example a Schottky diode, attached to one end.

In yet another embodiment the present invention includes an apparatus for making measurements at a contact point of an integrated circuit. The apparatus includes an AC power source, a probe having a probe body, a probe tip and a planar waveguide extending along the body from the probe tip to a location of the probe body in which a coaxial conductor connects the power source to the planar waveguide. Further, the power detector is mounted co-planar to the waveguide and proximate to probe tip in order to generate a DC signal in response to an AC signal received at the probe tip from the power source.

The present invention also includes a method for monitoring power levels at the tip of a measurement probe including the steps of transmitting a wave signal to a measurement probe, transmitting the wave signal through a waveguide of the measurement probe to a probe tip, and monitoring the power of the wave signal proximate the probe tip. In another aspect, a method for controlling the power delivered by a power source to a circuit is disclosed. This method includes generating a wave signal from a power source, transmitting the wave signal from the power source to a probe, monitoring the power of the wave signal within the probe, transmitting a control signal from the probe to the power source, and adjusting the power source in response to the control signal.

DETAILED DESCRIPTION

According to the present invention, a directional coupler circuit is provided within a measurement probe. The directional coupler is placed within the probe, such as proximate to a coplanar waveguide signal line so that the power output at the measurement probe may be accurately determined. Monitoring the power at the measurement probe results in a power measurement made close to the probe tip. Thus, power fluctuations typically caused by test system connections and the coaxial cable may be monitored. Further, placement of the power monitoring components within the probe tip itself provides a more accurate measurement of the actual power delivered to a structure such as a microwave integrated circuit. Integrating a power measurement device directly within a measurement probe also helps to eliminate additional separate components and connections that are otherwise required when using discrete power measurement devices that are coaxially connected between a power source and the measurement probe. The measurement probe of the present invention avoids potential mismatches between discrete coaxially-connected power measurement devices so that the power measurements are more accurate.

Figure 4:
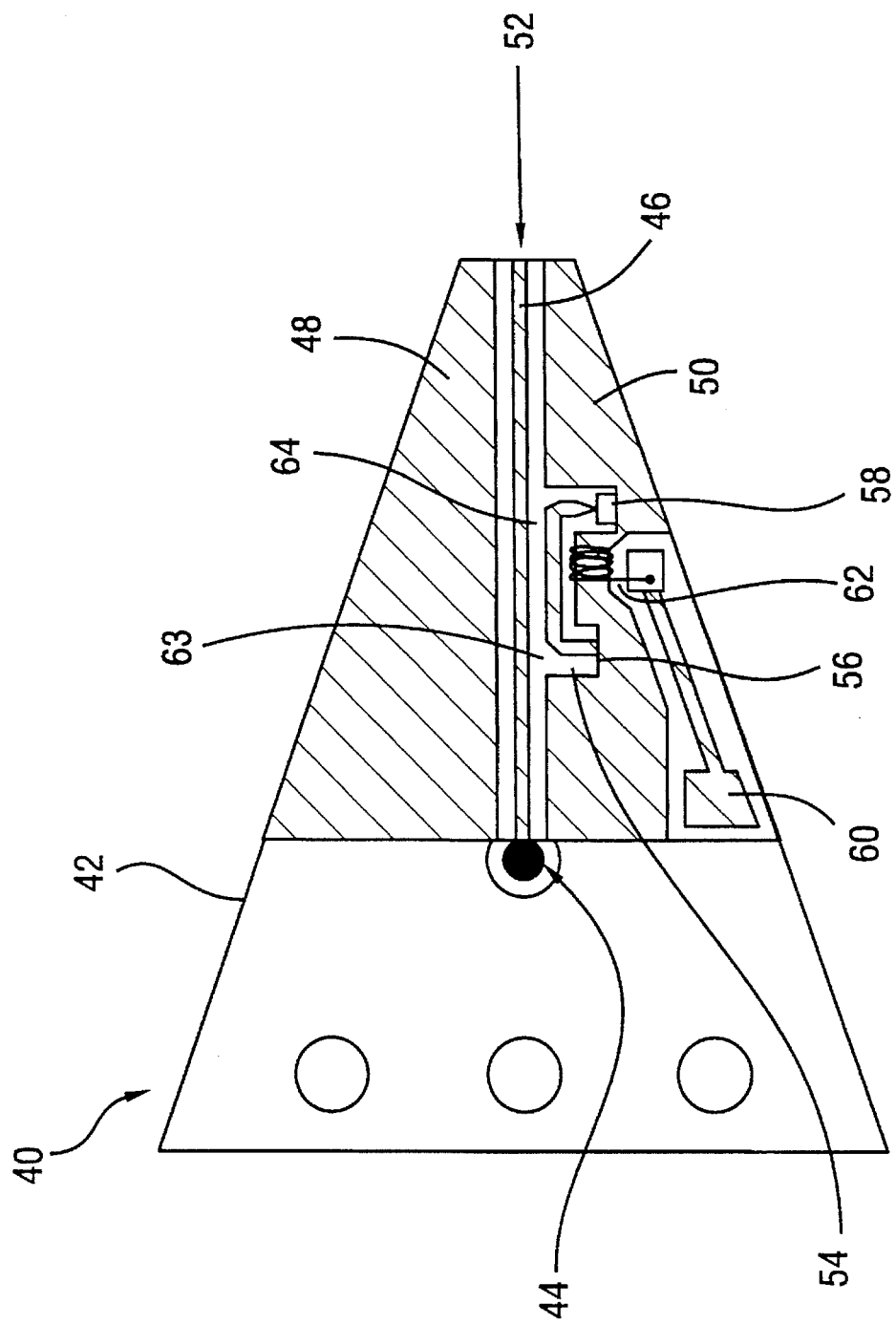
FIG. 4 is a bottom view of a measurement probe according to the present invention.

FIG. 4 shows a bottom view of a measurement probe 40 according to the present invention. Measurement probe 40 has a coplanar waveguide surface 42. Coplanar waveguide surface 42 includes coaxial to coplanar waveguide connection 44, coplanar waveguide signal line 46, and coplanar waveguide ground planes 48 and 50. Coplanar waveguide signal line 46 extends from connection 44 to probe tip 52. A coplanar waveguide directional coupler 54 is placed proximate the coplanar waveguide signal line 46. For example, as shown in FIG. 4, coplanar waveguide ground plane 50 may be shaped so that coplanar directional coupler 54 may be placed on surface 42 proximate coplanar waveguide signal line 46. The reverse-wave coupled arm (an end) of directional coupler 54 is electrically connected to ground plane 50 through a matched termination resistor 56, for example, a 50-ohm thin film resistor. The forward-wave coupled arm (the other end) of directional coupler 54 is connected to Schottky diode detector 58. Further, a DC output tap 62 is connected to directional coupler 54 adjacent Schottky diode detector 58. A DC output connector 60 is electrically connected to DC output tap 62. DC output connector 60 may be, for example, a coaxial connection on the side of the probe body. However, other suitable DC contact methods may be used.

Figure 1:
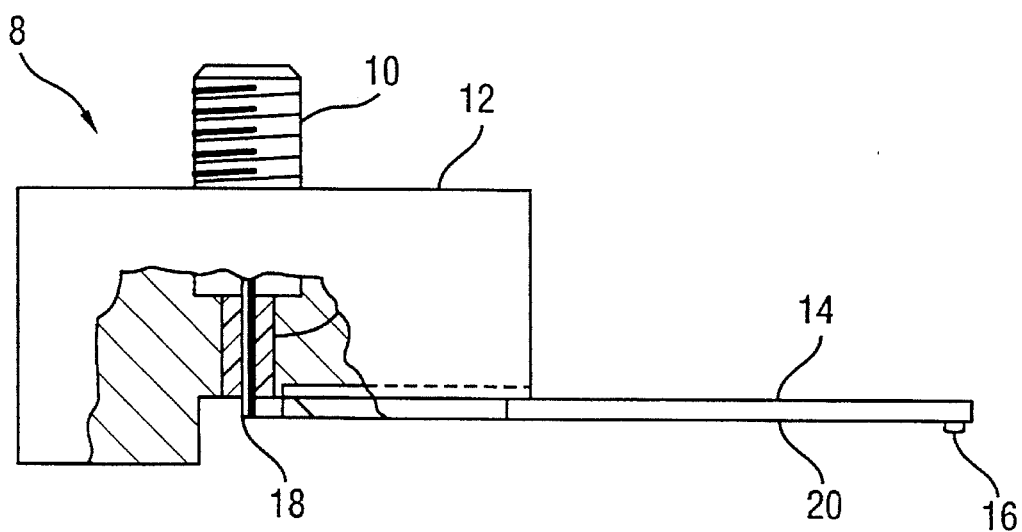
FIG. 1 is a side view of a prior art measurement probe.
Figure 2:
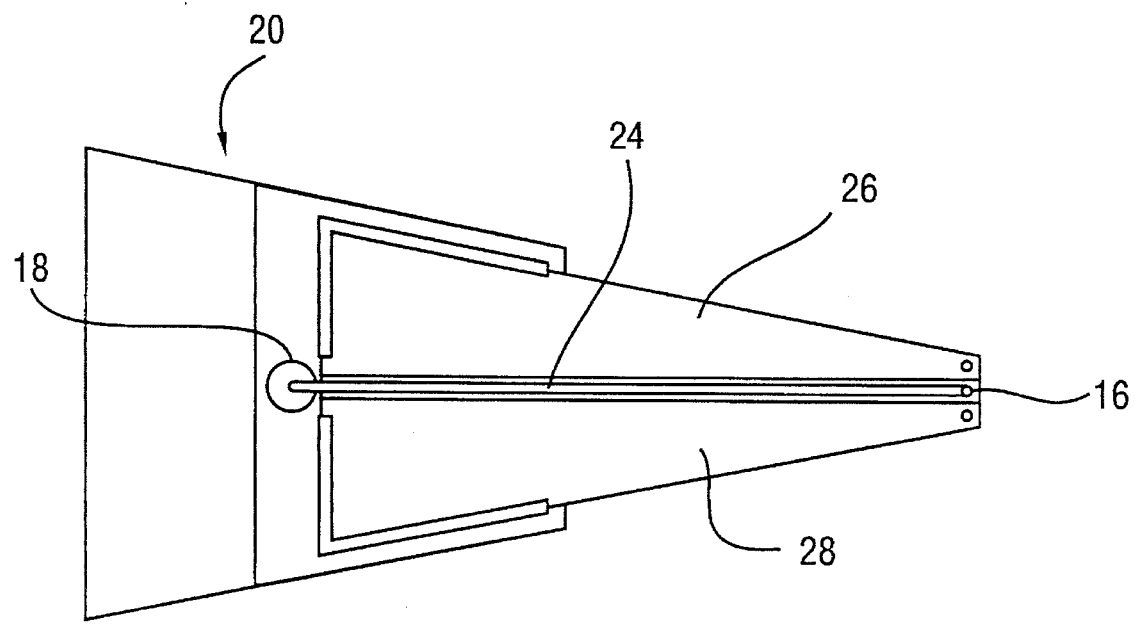
FIG. 2 is a bottom view of the probe shown in FIG. 1.
Figure 3:
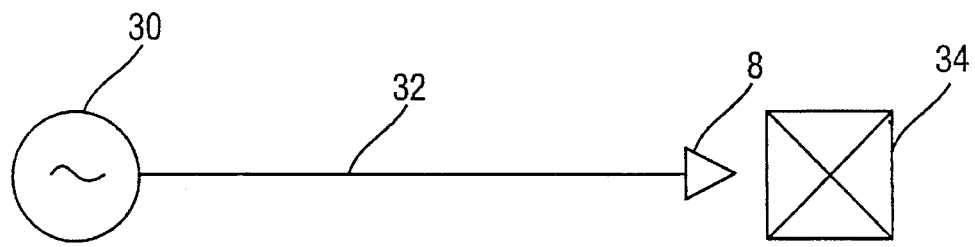
FIG. 3 shows a block diagram of a prior art test configuration using a microwave or millimeter wave measurement probe.
Figure 5:
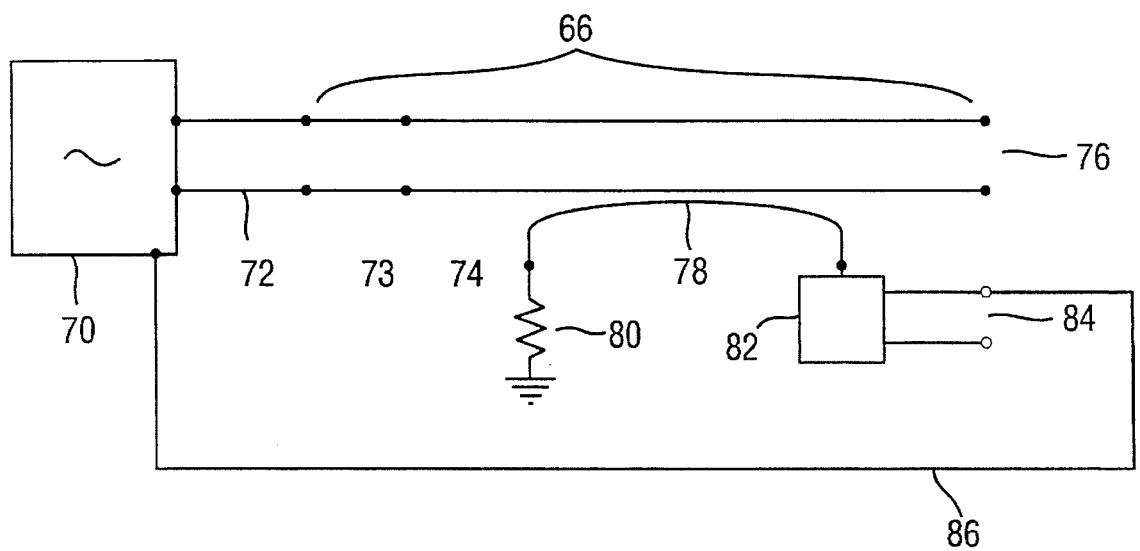
FIG. 5 is an electrical schematic of a measurement probe according to the present invention.

An electrical schematic of a measurement probe according to the present invention is presented in FIG. 5. In FIG. 5, a signal source 70 is connected through coaxial cable 72 to measurement probe 66. Within measurement probe 66, the signal travels through a coaxial to coplanar waveguide transition 73 and coplanar waveguide 74 to probe tip 76. Electrically coupled to coplanar waveguide 74 is directional coupler 78. The coupled ports of the directional coupler 78 are preferably terminated respectively with a matched termination resistor 80 on one port and a matched Schottky detector diode 82 on the other port. Though preferable, the terminations do not necessarily have to be matched. DC output 84 monitors the DC voltage across the Schottky detector diode 82. Feedback line 86 transmits the probe tip DC output measurement to source 70 so that the output power of source 70 may be adjusted in order to maintain a more constant power at probe tip 76.

The present invention is not limited to use of coplanar waveguides. Microstrip probes are also known in the art and may be adapted for use with the present invention. In this embodiment, a directional coupler and a diode are still formed in the probe as with other embodiments. A microstrip line is formed on one surface of the probe while a backside ground plane is formed on the back surface of the probe. The directional coupler is placed proximate the microstrip line to detect the signal passing through the microstrip line. A diode and DC output, as described above, may also be used in this embodiment of the invention.

In yet another embodiment, a thermistor may be connected to the directional coupler instead of a diode. In this embodiment, instead of monitoring the DC voltage across a diode, the resistance of the thermistor is monitored to create the signal that is used to control the source. Thus, as shown in FIG. 5, block 82, may alternatively be a thermistor while output 84 is used to monitor the resistance of the thermistor. As the power coupled to the directional coupler changes, the power dissipated through the thermistor (and thus the temperature of the thermistor) also changes. Since the resistance of the thermistor will change as its temperature changes, monitoring the resistance of the thermistor indicates the power of the signal at the probe. Then, the source power may be adjusted to maintain a desired power at the probe tip.

The components of the measurement probe shown in FIG. 4 may be constructed using a variety materials and methods. Typically, the substrate of the probe is alumina ($Al_2O_3$), quartz, teflon, or teflon-based materials. Also, the coplanar waveguide signal line 46 and ground planes 48 and 50 are multilayer structures made of titanium, aluminum, nickel, tungsten, gold or a combination of these and/or other conductive materials. Likewise, the directional coupler is preferably made of titanium, aluminum, nickel, tungsten or gold. The resistor 80 is preferably made from nichrome (NiCr), tantalum nitride (TAN), nickel, titanium, chrome or tantalum. However, other suitable materials may be used for all of these components.

FIG. 4 shows directional coupler 54 proximate a coplanar waveguide signal line 46. Directional couplers are well known in the art. When a directional coupler is placed adjacent a signal transmission line, a small fraction of signal power is coupled to a coupled arm of the directional coupler, typically 0.01% to 10% of the signal strength of the transmission line signal. Coupling between the signal line and the directional coupler would typically be about 20 dB to minimize perturbations to the primary signal. However, other coupling factors may be used. In a preferred embodiment, the length between points 63 and 64 is approximately λ/4, where λ is the wavelength of the source signal as it propagates along the coupler. Where a range of source signal frequencies is used, it is desirable that this length be chosen at the center of the frequency range. Choosing this length of about λ/4 provides a balanced response about the center frequency. The spacing between directional coupler 54 and coplanar waveguide signal line depends closely on the desired coupling factor; spacing effects are well known in the art, as in, for example, Wen, C. P., "Coplanar-Waveguide Directional Couplers", IEEE Trans. on *Microwave Theory and Techniques*, Vol. MTT–18, No. 6, June 1970, pp. 318–322. Depending upon a the specific power range, frequency range, materials, and probe circuit design, a user would design an appropriate distance between the directional coupler and the signal line.

It is preferred that the directional coupler 54, resistor 56, and diode 58 to be matched in order to minimize unwanted reflection signals. Termination resistors such as resistor 56 are often 50 ohm resistors since the impedance characteristics of commercially available connectors and microwave circuits are typically 50 ohms. Thus, if a 50 ohm resistor is used, the dimensions of the coupler are preferably designed to effect an appropriate match. Alternatively, other resistor values and coupler dimensions may be used, though, preferably they should be chosen to create a matched circuit. Likewise, it is preferable to match the coupler and the diode within the operating frequency range.

Figure 6:
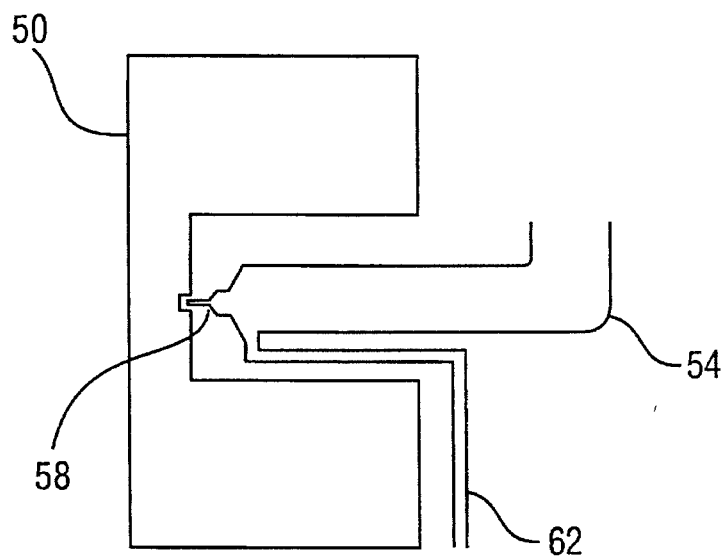
FIG. 6 is an expanded view of one end of a directional coupler according to the present invention.

As shown in FIG. 4, in accordance with the present invention a diode 58 may be connected between the directional coupler 54 and ground plane 50. The diode preferably is a Schottky diode, though other diodes may be used. The diode junction may be formed in a variety of methods known in the art. A preferable diode junction ms shown in FIG. 6 and more fully disclosed in J. L. Allen, C-Y. Chen and D. P. Klemer, "On-wafer measurement of modeling of millimeter-wave GaAs Schottky mixer diodes", 1992 IEEE MTT-S International Microwave Symposium Digest, pp. 743–746, 1992 IEEE MTT-S International Microwave Symposium, Albuquerque, N. M.; June 1992, which is hereby expressly incorporated by reference. In FIG. 6, directional coupler 54 terminates at Schottky diode 58. The Schottky diode in turn connects to ground plane 50 through an ohmic contact to be substrate. DC output tap 62 is electrically connected to directional coupler 58 proximate Schottky diode 58.

Figure 7:
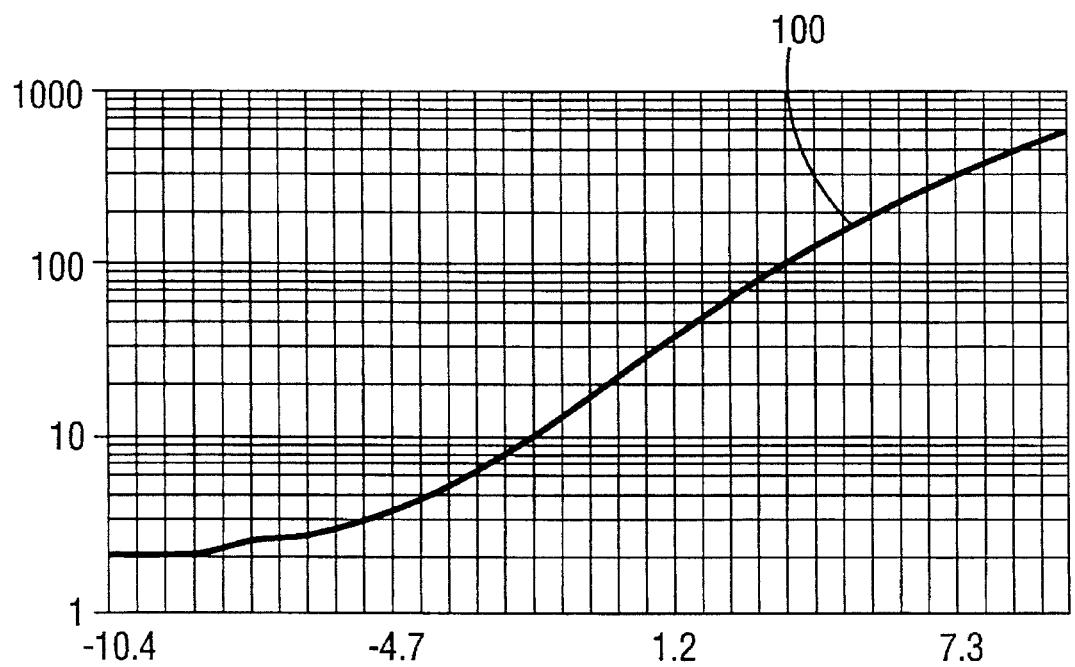
FIG. 7 is a graph illustrating a diode response curve of a measurement probe according to the present invention.

Because of the response characteristics of diode 58, the DC output voltage at DC output tap 62 will vary as the RF power coupled into directional coupler 54 varies. For example, FIG. 7 illustrates the diode response at 50 GHz RF excitation. The horizontal axis represents RF power as measured in dBm units and the vertical axis represents the DC output voltage magnitude of a diode as measured in millivolt units. As shown by response curve 100, the DC output voltage is a function of the RF power.

Though shown as an interconnect line in FIG. 6, DC output tap 62 may also include a DC capacitor so that the output may be filtered. Alternatively, output tap 62 may be an inductive coil. An inductive coil would help minimize RF leakage through the output tap.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Various changes may be made in the method and apparatus. Further, equivalent elements or materials may be substituted for those illustrated and described herein, and certain features of the invention may be utilized independently of the use of other features, all as would be apparent to one skilled in the art after having the benefit of this description of the invention.

What is claimed is:

1. A probe for integrated circuits comprising:

a probe tip;

a signal conductor, said signal conductor operable to provide a first signal from an external source to said probe tip;

a power detector circuit proximate to said probe tip operable to generate a second signal in response to and indicative of the power of the first signal provided along said signal conductor to said probe tip; and a feedback circuit adapted to provide a control signal from said power detector circuit to said external signal source, wherein said power detector circuit comprises:

a directional coupler proximate said signal conductor, a first end of said directional coupler connected to ground; and a diode coupled to a second end of said directional coupler.

2. The probe of claim 1, wherein said signal conductor comprises:

a waveguide signal line; and at least one waveguide ground plane co-planar with and proximate said waveguide signal line.

3. The probe of claim 1, wherein said signal conductor comprises:

a micro-strip line; and a ground plane.

4. The probe of claim 1, wherein said diode is a Schottky diode.

5. The probe of claim 1, further comprising a matched termination resistor connecting the first end of the directional coupler to ground.

6. A device for probing an integrated circuit which comprises:

a probe including a probe tip, a ground plane, and a signal conductor adapted to conduct an AC signal from an AC power source to the probe tip, said signal conductor connected to said probe tip and coupled to said ground plane;

a power detector mounted on the probe operable to generate a DC signal in response to and indicative of, the power of an AC signal received at the probe tip from the AC power source; and a feedback loop adapted to conduct a DC signal as a power control signal from the power detector to the AC power source.

7. The device of claim 6, wherein the power detector comprises:

a directional coupler mounted proximate the probe tip, said directional coupler having a ground connection at one end and a signal output at the other end; and a diode connected to the output of the directional coupler and the feedback loop so long as to provide the feedback loop with a DC signal responsive to the signal output of the directional coupler.

8. The device of claim 7, wherein the diode comprises a Schottky diode.

9. An apparatus for probing a contact point of an integrated circuit comprising:

an AC power source;

a probe, including a probe body, a probe tip at one end of the probe body, and a planar waveguide extending along the probe body from the probe tip to a first location of the probe body;

a coaxial conductor interconnecting the power source and the planar waveguide at said first location of the probe body;

a power detector mounted co-planar to said waveguide and proximate the probe tip operable to generate a DC signal in response to an AC signal received at the probe tip from the power source; and a feedback circuit arranged to conduct a DC signal as a power control signal from the power detector to the AC power source.

10. A method of controlling the power delivered by a power source to a circuit, comprising the steps of:

generating a wave signal with said power source;

transmitting said wave signal from said power source to a probe;

monitoring the power of said wave signal within said probe;

transmitting a control signal from said probe to said power source, said control signal indicative of the power of said wave signal within said probe;

adjusting said power source in response to said control signal.

11. The method of claim 10, said monitoring step comprising:

coupling a directional coupler to said wave signal within said probe proximate a probe tip;

connecting a diode to said directional coupler; and sensing a voltage across said diode.

* * * * *